United States Patent [19]

Maselli

[11] 4,113,485
[45] Sep. 12, 1978

[54] PROCESS FOR MAKING PHOTO-MECHANICAL DROP-OUT MASK

[76] Inventor: Vincent M. Maselli, 8909 McVicker Ave., Morton Grove, Ill. 60053

[21] Appl. No.: 802,798

[22] Filed: Jun. 2, 1977

[51] Int. Cl.² .................. G03C 7/04; G03C 7/16; G03C 5/06
[52] U.S. Cl. ............................. 96/5; 96/6; 96/17; 96/38.3; 96/44; 355/125
[58] Field of Search .............. 96/5, 44, 38.3, 70, 96/17, 6; 355/125, 77

[56] References Cited

U.S. PATENT DOCUMENTS 1,670,195  5/1928  Gerland ........................... 96/44 X

OTHER PUBLICATIONS

Erwin Jaffe, et al. Color Separation For Offset Lithography with an Introduction to Masking, 1960–Lithographic Technical Foundation, Inc., N.Y., pp. 81 and 82.

*Primary Examiner*—Edward C. Kimlin
*Assistant Examiner*—Alfonso T. Suro Picó
*Attorney, Agent, or Firm*—Darbo & Vandenburgh

[57] ABSTRACT

A photograph of an object is made on color film in a conventional manner. Then the object is back-lighted only to silhouette it and a second photograph is made using the same film. The two films are developed simultaneously so as to subject them to identical processing conditions. Using the photograph taken while the object was back-lighted, a contact exposure is made on a high contrast film to produce a negative. After development of this negative, it and the initial, front-lighted, photograph of the object are employed on a scanner to produce the color separations for printing purposes.

7 Claims, No Drawings

PROCESS FOR MAKING PHOTO-MECHANICAL DROP-OUT MASK

BACKGROUND AND SUMMARY OF THE INVENTION

In many printed works, e.g., catalogs, there are reproductions of a color photograph of an object with a plain background surrounding the object. As the term "object" is employed herein, it might be animate or inanimate and pertains to that part of the original photograph that is to be retained in the final reproduction. The plain background referred to might or might not be colored. The present practice employed in arriving at such a printed reproduction of an object commences with the photographing of the object on positive, color film. Then a "mask", or more correctly a "photo-mechanical drop-out mask", is produced on film. In this mask the areas corresponding to the location of the object (or parts thereof) are transparent while the remainder is opaque.

Present commercial practices generally involve one of two procedures for making the mask. In one a second photograph is taken at the same general time that the positive is made. This second photograph is made on a negative film having no range of values (high contrast). In the other procedure the initial positive is put on a scanner which produces a second positive (thus permitting an artist to touch up the second positive, as hereinafter discussed), and a negative subsequently is made from the second positive.

After the drop-out mask is produced it and the original positive photograph are put on a scanner (or employed in any other customary method used in making color separations) which then makes the color separations employed in the printing process. A scanner has a light transmitting surface (usually cylindrical) against which the photograph and mask are positioned at separate locations. Light is shown through the two and converted into electrical signals which are then employed, with such modifications as to size, etc., as desired, to produce the separations. Such devices are well known in the art.

Two problems have plagued the industry in the production of the mask. One of these is loss of detail. For example, assume that a photograph of a bicycle is being made for a catalog. The spokes of the wheels of the bicycle appear as fine lines. The mask must block out everything around these fine lines. The conventional processes often lose such details and it is necessary for an artist to reapply such details to the negative mask. This is a very tedious and time-consuming operation. Consequently, it is expensive. Furthermore, it usually requires that the photographs be made oversize as compared to the size of the reproductions that are to be ultimately printed. By making the photographs initially large, the artist has an easier time of reinserting the details that may have been lost in the mask. The size can be adjusted downwardly as required in the production of the separations in the scanner. However, due to the fact that they are large they occupy more of the scanning surface in the scanner thus limiting the number of photographs that can be processed simultaneously in the scanner. In other words, a number of small photographs can normally be put in the scanner in the same space occupied by one large one and color separations produced for each of the small photographs simultaneously.

The other of the problems occurs primarily in the procedure wherein a second photograph on high contrast film is taken at the same time that the color photograph to be reproduced is taken. The two films, being of different characters, will not always end up with exactly the same dimensions after the development process. The error in size between the two may at one time be relatively minor and the next time be very substantial. When the error is very minor, procedures employed in connection with the scanning operation may permit its correction. However, a major error cannot be tolerated. Until the mask has been completed and compared with the positive photograph, a photographer never knows just what kind of an error situation he may have. This may be two hours or more. Since a substantial error will require the taking of additional photographs, the photographer normally will feel that he must maintain his photographic setup until the films can be compared. This is tying up his studio layout and thus is costly to the photographer in terms of efficient production. Furthermore, invariably there is little available time between the deadline for the completion of a catalog and the date when the order is given to the photographer to produce the photographs. With little time available, the delays involved in repeating photographic operations can be deadly. Under present commercial practices, it is not uncommon to have only about forty percent of the photographs taken to be within acceptable tolerances so far as size variation is concerned.

In the process devised by me, at the same time (immediately before or after) the color film is exposed for the purpose of making the positive film, a second exposure is made on the same type of film but with the object being photographed being essentially only back-lighted. Thus the second exposure produces a silhouette of the object on the color film. The two units of the color film bearing these two exposures are processed simultaneously. Thus, there is no possibility for variations in processing conditions which might otherwise cause errors in the size of the object images appearing upon the two units of film. The silhouette photograph is then employed to produce a drop-out mask on a high contrast film.

The use of my procedure will reduce the occurrence of size errors between the mask and the positive photograph to something like three percent of the photographs taken. The resulting mask will have substantially all of the required details without the necessity for an artist reinserting detail. Since the operations previously performed by an artist are no longer necessary, the photographs may be made substantially smaller thus permitting a number of them to be put into the scanner simultaneously.

DESCRIPTION OF SPECIFIC EMBODIMENT

The following disclosure is offered for public dissemination in return for the grant of a patent. Although it is detailed to ensure adequacy and aid understanding, this is not intended to prejudice that purpose of a patent which is to cover each new inventive concept therein no matter how others may later disguise it by variations in form or additions or further improvements.

In the process of my invention, the object is front-lighted, preferably against a light gray background, and an exposure is made in the conventional manner on a unit of reversal color film (the result of this exposure being referred to herein as the principal photograph).

This produces what will be the positive photograph of the object to be reproduced. Then, using another unit of the identical film a second exposure is made with the object being substantially only back-lighted. Thus the front lighting used in the first photograph is removed and the gray background previously employed is flooded with light so as to back-light the object. Thus, what appears on the film of the second exposure is a silhouette of the object. The two photographs are made substantially simultaneously in the sense that the physical arrangement remains the same, e.g., the camera or the object, etc., is not moved. Which photograph is actually taken first is unimportant.

The two units of film bearing these two exposures are then developed together so as to ensure that they are exposed to identical processing conditions. This is important since variations (normally inconsequential) in the processing conditions may result in variations in the image size appearing on the film. Such size variations are, an anathema to one who is attempting to fit a mask to the positive photograph. The actual processing of the two units of film is conventional. After the processing is complete, which may be a matter of minutes, the two photographs may be overlaid and compared to make sure that the silhouette contains the required detail and that the object size corresponds with that on the positive photograph.

The silhouette exposure is then used to produce a negative on high contrast film, conventionally referred to as line film. Line film is commonly used for photo drop-out masks. For example, the color film bearing the silhouette is laid over a sheet of line film and the line film is exposed through the silhouette. Preferably, this is done in as short a time as possible before the positive photograph and the mask are to be put on a scanner, but in any event, it should not be more than two weeks before they are put on the scanner. During the period of time between the making of the original two photographs and the making of the exposure on line film, the two, processed units of film (one bearing the positive photograph and the other the silhouette) are kept together to eliminate the possibility of variations in size developing which would cause problems. Of course, after the line film is exposed it is developed in the conventional manner.

The engraver then puts the positive, color film photograph and the line film mask on a scanner. Scanners and their techniques of operation, etc., are well known and thoroughly discussed in the literature. See, for example, U.S. Pat. No. 3,450,830 for an illustration. The scanner produces the color separations. It is important that both the positive and the mask be put on the scanner at the same time (in the sense that the settings of the scanner are not changed) since it is extremely difficult to exactly repeat the scanner settings. It is also important that the scanner surface upon which the films are placed be the same distance from the emulsion of both of the films. The scanner surface normally is a drum and the emulsion side of the film is positioned away from the drum. Thus, if the film bearing the positive photograph and the mask respectively are of a different thickness, which normally will be the case, provision must be made to move the emulsion side of the thinner film outwardly of the drum farther than the thickness of the thinner film. For example, the color film may have a thickness of ten-thousandths of an inch (0.254 m.m.) and the line film used for the mask may have a thickness of five-thousandths of an inch (0.127 m.m.). To move the emulsion side of the mask a shim in the form of a second, plain sheet of film five-thousandths of an inch thick is placed between the mask and the drum.

I claim:

1. A method of making a photo-mechanical drop-out mask to be used with a principal photograph taken of an object, which principal photograph was made by exposing a first portion of a given film in a camera positioned at a given location, said method comprising the steps of:
   illuminating the object with substantially only a back illumination so as to silhouette the object;
   while the object is so illuminated, taking a second photograph of the object using said camera at said location and using a second portion of said given film in said camera to produce a silhouette of the object on the second portion of the film;
   processing both of said portions of said film under identical conditions to develop the film; and
   exposing a high-contrast film to the developed second portion of the film to produce a negative of said silhouette on said high-contrast film from said second portion which constitutes the said drop-out mask.

2. A method as set forth in claim 1, wherein said two portions of film are exposed in said camera sequentially within a relatively short period of time and with the camera not being significantly disturbed between the two exposures.

3. A method as set forth in claim 1, wherein the processing of the two portions of film is carried out substantially simultaneously.

4. A method as set forth in claim 2, wherein the negative on high contrast film is produced from said second portion within about 2 weeks from the time that the second portion is processed.

5. In the method of making color separations of a picture of an object against a plain background wherein a positive transparency bearing an image of the object and a photomechanical drop-out mask of said object are produced and placed on a scanning surface means of a scanning machine for the making of the separations, said mask being made by utilizing another photograph of said object, and wherein in the production of said positive transparency the object is front-lighted to a significant extent and photographed using a portion of a given film, which portion is then processed to establish said image in the emulsion of the film, the improvement comprising:
   removing said front-lighting and back-lighting the object;
   while the object is back-lighted, taking a second photograph of the object using another portion of said given film;
   processing said other portion along with the first to establish a silhouette of the object in the emulsion of the second portion; and
   producing said mask from the silhouette in the processed other portion, by exposing a high-contrast film to said silhouette, and developing said high-contrast film.

6. In the method of claim 5, wherein the processed first mentioned portion of film is positioned on said scanning surface means with its emulsion a given distance from said scanning surface means, and said mask is placed on the scanning surface means with its emulsion the same distance from the surface.

7. In the method of claim 6, wherein said positive transparencies and said masks are relatively small in relation to the size of said surface means and a plurality of each are placed on said surface means simultaneously for the simultaneous production separations, and the separations are cut apart after being produced.

* * * * *